United States Patent [19]

Tsuzuki et al.

[11] Patent Number: 4,680,608
[45] Date of Patent: Jul. 14, 1987

[54] SEMICONDUCTOR DEVICE

[75] Inventors: Yukio Tsuzuki, Nukata; Masami Yamaoka, Anjo; Shoji Toyoshima, Kounan, all of Japan

[73] Assignee: Nippondenso Co., Ltd., Kariya, Japan

[21] Appl. No.: 697,571

[22] Filed: Feb. 1, 1985

[30] Foreign Application Priority Data

Feb. 7, 1984 [JP] Japan .................. 59-21324

[51] Int. Cl.⁴ .................................. H01L 29/72
[52] U.S. Cl. ........................ 357/36; 357/34; 357/20
[58] Field of Search ................ 357/34, 36, 20

[56] References Cited

U.S. PATENT DOCUMENTS 3,911,473  10/1975  Nienhujs ................ 357/36
4,054,897  10/1977  Fukuda ................... 357/36
4,506,280  3/1985   Merrill .................... 357/36
4,586,072  4/1986   Nakatani ................. 357/36

FOREIGN PATENT DOCUMENTS 54-150980  11/1979  Japan .
55-162267  12/1980  Japan .

Primary Examiner—Andrew J. James
Assistant Examiner—Mark Prenty
Attorney, Agent, or Firm—Cushman, Darby & Cushman

[57] ABSTRACT

This application describes a semiconductor device having a power amplifier pattern consisting of a plurality of parallel-connected transistor unit cells with emitters thereof being arrayed like meshes, wherein the width of the emitter of each transistor unit cell is not in excess of 50 microns. The limitation of the emitter width contributes to enhancement of the reverse-bias breakdown endurance.

4 Claims, 6 Drawing Figures

SEMICONDUCTOR DEVICE

BACKGROUND OF THE INVENTION

The present invention relates to a semiconductor device for use in amplification of power and, more particularly, to the structure of a power transistor designed to enhance reverse-bias breakdown endurance so as to extend the area of safe operation (ASO).

For enhancing the reverse-bias breakdown endurance (Ersb) of a power transistor, there are generally known the following techniques. A first technique includes enlarging a chip size and increasing the number of transistor unit cells, to reduce the current density per unit cell. A second possible technique is widening the base of each unit cell immediately below its emitter, or widening its collector layer of a low impurity concentration. Then, upon application of a reverse bias between the base and emitter, expanding the electron flow between the collector and emitter while reducing the electron density in the juction, thereby preventing localized flow of the electrons. A third known technique uses increasing the impurity concentration in the base or that in the collector layer of a low impurity concentration. According to the techniques mentioned above, occurrence of any hot spot can be avoided to prevent secondary breakdown, hence achieving some improvement in the reverse-bias breakdown endurance.

However, the first method that enlarges the chip size naturally brings about an increase of the production cost. In the second method, some deterioration is unavoidable with regard to the current amplification characteristics due to the fact that principally the collector current is decreased at the maximal current amplification factor. As for the third method which raises the impurity concentration in the collector layer, there exist disadvantages including reduction of the voltage withstanding capability. It has been customary heretofore that, because of a mutually contrary relationship existing between the reverse-bias breakdown endurance and the current characteristic or withstanding voltage characteristic, the power transistor is designed to be optimal with trade off of such two characteristics.

It is well known that the electric characteristics of a power transistor are associated with a peripheral length ($l_E$) of its emitter. For example, one important electric characteristic is the relationship among the peripheral length ($l_E$) of an emitter, a collector-emitter saturation voltage Vce (SAT) and a reduction (value n) induced in a current amplification factor $h_{fe}$ at a flow of large current. In such relationship, both the saturation voltage Vce (SAT) and the value n are sequentially reduced in accordance with an increase of the length $l_E$ to enhance the characteristic to a certain extent until arrival of $l_E$ at a predetermined value $l_{EO}$. However, posterior to such point, the characteristic reaches saturation and therefore fails to be improved despite any further increase of $l_E$.

Meanwhile, with regard to the relationship between the width $L_E$ of an emitter and the peripheral length $l_E$ thereof, the integration density of transistor unit cells can be raised in the case of a mesh emitter type pattern to increase the peripheral length $l_E$ in proportion to a reduction of the emitter width $L_E$ with the chip size remaining unchanged. However, as described above, no enhancement is attainable in the electric characteristics by decreasing the emitter width $L_E$ and increasing the peripheral length $l_E$ up to any region beyond the aforesaid predetermined value $l_{EO}$. Since a sufficient peripheral length $l_E$ is obtainable with an emitter width $L_E$ of 70 microns or more, it has been considered meaningless to reduce the emitter width further than the above value in view of the electric characteristics. As for the reverse-bias breakdown endurance Ersb, although its value can be augmented by narrowing the emitter width $L_E$ and increasing its peripheral length $l_E$ it has been believed that, as represented by the characteristic (a) in FIG. 3, the improvement attainable is merely slight on the known extension line. Furthermore, if the emitter width is reduced for achieving a high yield rate in the process of production, it becomes necessary to render the pattern finer to eventually bring about deterioration of the yield rate on the contrary. Therefore, in the conventional design, it has been customary to set the emitter width $L_E$ at a value suited for obtaining an adequate emitter peripheral length $l_E$ which is slightly greater than the aforesaid predetermined value $l_{EO}$. For the reasons given above, the emitter width of the ordinary mesh emitter type power transistor in general use today is so established as to range from 70 to 100 microns or more, and any emitter width narrower than that has never been adopted in design.

SUMMARY OF THE INVENTION

The present invention has been accomplished in an attempt to eliminate the disadvantages mentioned. And its object is to provide an improved semiconductor device having a power amplifier pattern of enhanced reverse-bias breakdown endurance without inducing any deterioration of its current characteristics and voltage withstand capability.

In the invention, the emitter width is not in excess of 50 microns, and is thus less than the lower limit of the emitter width in a conventional device. The effect of an emitter width of less than 50 microns is found by the present inventors for the first time. Thus effect is that by eliminating a localized current flow more than expected, the reverse-bias endurance is enhanced more than expected.

BRIEF DESCRIPTION OF THE DRAWINGS

The exact nature of this invention, as well as other objects and advantages thereof, will be readily apparent from consideration of the following specification relating to the accompanying sheets of drawings, in which.

DETAILED DESCRIPTION OF THE INVENTION

In a semiconductor device equipped with a power amplifier pattern consisting of a plurality of parallel-connected transistor unit cells, the feature of the present invention resides in that the emitter width of each unit cell is not in excess of 50 microns.

The semiconductor device of this invention has a power amplifier pattern with an array of parallel-connected transistor unit cells which are functionally equivalent to one another. If the entirety of the device consists merely of a repeated pattern of individual transistor unit cells, the entirety is a power amplifier serving as a power transistor IC (integrated circuit). Here the 'semiconductor device' is defined also as an IC which includes a power amplifier pattern with a repeated array of transistor unit cells in a Darlington connection. In this case, the transistors in the present invention are those constituting the output stage of such device. Furthermore, the above semiconductor device may be an IC with the aforesaid power amplifier pattern formed on a single substrate together with components of other functions, or may be a hybrid IC with such components. The power amplifier pattern is of a mesh emitter type in which individual emitters are arrayed like meshes.

The present inventors have found that, as a result of measuring the reverse-bias breakdown endurance (Ersb) in a mesh emitter type power transistor while changing its emitter width to various dimensions, the endurance (Ersb) can be enhanced to a much greater extent than the known range by positively reducing the emitter width beyond the limit selected customarily heretofore.

Figure 3:
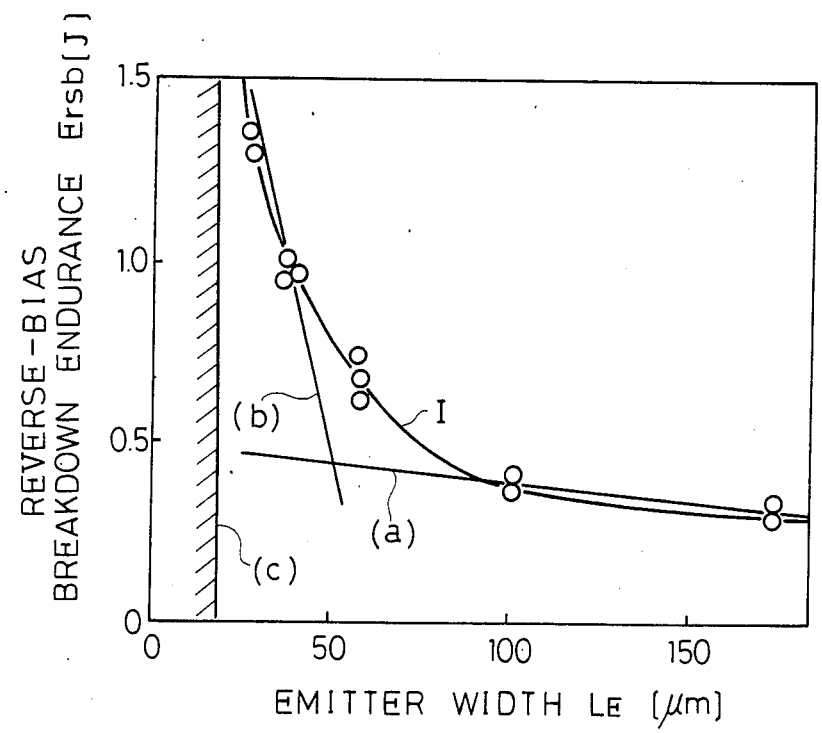
FIG. 3 graphically shows the result of measuring the reverse-bias breakdown endurance in the device of FIG. 1 with its emitter width changed.

Curve I in FIG. 3 shows the result of an experiment conducted under the condition that the number of unit cells constituting a power transistor is kept unchanged, and the thickness of each of collectors, emitters and bases is set at a fixed value as well as the impurity concentration thereof being fixed. The emitter width $L_E$ in each unit cell (width L) of the transistor is changed, and an experimental result is obtained by measuring the relationship between the emitter width $L_E$ and the reverse-bias breakdown endurance. As will be understood from Curve I of FIG. 3, the reverse-bias breakdown endurance is enhanced remarkably in accordance with reduction of the emitter width $L_E$ to 50 microns or less, as represented by the characteristic (b) instead of being on the extension line of the known characteristic (a). Such a phenomenon is considered to be based on the following reason. That is, when the base-emitter voltage is changed from a forward bias to a reverse bias, minority carriers injected into the base are rendered extinct instantaneously by the reverse bias since the emitter width $L_E$ is small, and consequently the minority carrier concentration in the base region immediately below the emitter is reduced to eventually prevent localized flow of current. This phenomenon becomes more conspicuous as the emitter width $L_E$ is further reduced, and the localized flow of current is substantially eliminated. It is a matter of course that a limit is existent in reducing the emitter width $L_E$ with regard to the steps of semiconductor production. Normally the actual emitter width $L_E$ ranges from 10 to 20 microns as represented by the characteristic (c) in FIG. 3.

The reverse-bias breakdown endurance can be enhanced four to five times in comparison with the conventional power amplifier device. In contrast to the known means that executes such endurance enhancement by increasing the base width or prolonging the life time of minority carriers in a high-resistance collector layer, the present invention is free from inducing deterioration of a rapid operation. Furthermore, since desired enhancement is attainable without reducing the resistivity of the high-resistance collector layer, there exists no possibility of deteriorating the voltage withstanding capability. In addition, the current amplification characteristic is not rendered inferior at all unlike the conventional means which raises the impurity concentraion in the base layer.

Obviously, many modifications and variations of the present invention are possible in the light of the above teachings. It is therefore to be understood that within the scope of the appended claims, the invention may be practiced otherwise than as specifically described.

DESCRIPTION OF THE PREFERRED EMBODIMENTS

Figure 1:
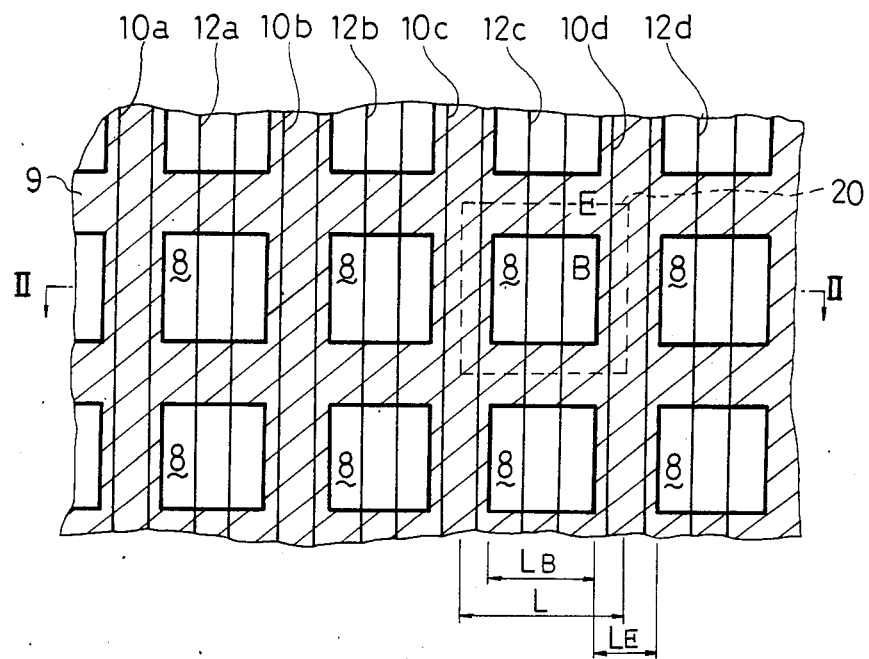
FIG. 1 is a plan view showing the structure of a first exemplary semiconductor device embodying the present invention.
Figure 2:
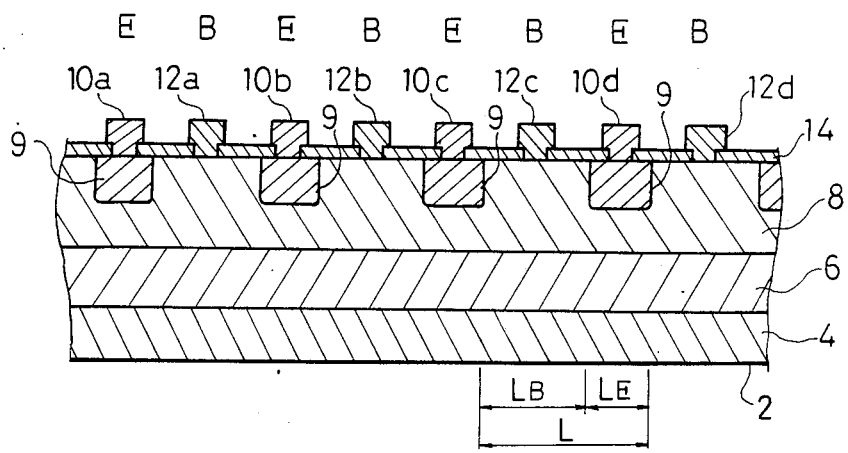
FIG. 2 is a sectional view taken along the line II—II in FIG. 1.

FIG. 1 is a plan view showing the structure of a first exemplary mesh emitter type high-voltage power transistor of the present invention with ratings including a withstand voltage of 200 volts or more and a current capacity of 1 ampere or more, and FIG. 2 is a sectional view taken along the line II—II in FIG. 1. An N-type collector layer 6 having, in this example, a resistivity of 50 ohm-cm and a thickness of 40 microns is formed by epitaxial growth on the upper surface of a high-concentration N+- type collector layer 4 (silicon substrate). In general, the resistivity and the thickness are selectively established at 40 to 60 ohm-cm and 30 microns or more respectively in accordance with individual requirements. In addition, a P-type base layer 8 is formed on the surface of the N-type collector layer 6 by diffusion in such a manner as to have, in this example, a sheet resistance of 50 to 60 ohms and a diffusion depth of 10 microns. It is a matter of course that formation of such P-type base layer 8 may be carried out by epitaxial growth. And subsequently, an N+-type emitter layer 9 is formed by selective diffusion. On the upper surface of the device thus obtained, windows are formed at positions for attaching electrodes of the base and emitter layers. In this arrangement, an insulator film 14 of silicon dioxide ($SiO_2$) is formed to cover the device surface with the exception of such windows. A pattern of emitter electrodes 10a, 10b, 10c and so forth is formed in a manner to linearly connect to the individual windows of the emitter layer 9. Similarly, a pattern of base electrodes 12a, 12b, 12c and so forth is formed in a manner to linearly connect to the individual windows of the base layer 8.

Meanwhile, a collector electrode 8 of nickel is formed on the reverse side of the N+- type collector layer 4. Thus, in the exemplary embodiment of this invention, the emitter layer 9 is in the form of a mesh pattern, where a section 20 enclosed with a broken line denotes a unit cell of the transistor. Therefore, in such mesh emitter type power transistor, the respective emitters, bases and collectors of the individual unit cells 20 are connected in parallel with one another.

In this embodiment, the emitter layer 9 has a width $L_E$ of 30 microns while the base layer 8 has a width $L_B$ of 120 microns and a pitch L of 150 microns. Accordingly, each unit cell 20 of the transistor is in the shape of a square with one side thereof having a length of 150 microns, and the power transistor device has 700 unit cells and a chip size of 5 mm square.

As a result of measuring the reverse-bias breakdown endurance in the device of the structure mentioned above, a value of 1.3 J has been obtained. Considering that the conventional power transistor device having an emitter width $L_E$ of 100 microns presents merely a value of 0.3 to 0.4 J, it signifies a great enhancement of the reverse-bias breakage endurance—being about four times the known value. With regard to other characteristics including a current amplification factor, the measured values indicate no inferiority at all in comparison with the conventional ones factor. As graphically shown in FIG. 3, the characteristic (a) known heretofore and the characteristic (b) found by the present inventors intersect at a point where the emitter has a width $L_E$ of approximately 50 microns. It has therefore been ascertained that a reverse-bias breakdown endurance (Ersb) higher than the known value is rendered attainable in the power transistor device by selectively setting the emitter width $L_E$ at a value smaller than 50 microns which corresponds to the intersection of the two characteristic lines. Accordingly, when a reverse bias is applied to the emitter-base junction, localized current flow to the center of the emitter is reduced to consequently prevent breakdown of the device that may otherwise be induced by secondary breakdown of the basecollector junction, whereby the bias breakdown endurance can be increased to sufficiently extend the area of safe operation.

However, since fine working for the semiconductor becomes considerably difficult in relation to a reduction of the emitter width, there naturally exists a limit in the step of production. In general, it is desired that the emitter width $L_E$ be within a range of 20 to 50 microns as the lower limit thereof is assumed to be about 10 to 20 microns.

Although the above embodiment represents an example where the number of unit cells constituting the power transistor is fixed, the same effect is achievable by selectively setting the emitter width $L_E$ within the aforesaid range even in the case of changing the rated current capacity with alteration of the number of such unit cells.

Meanwhile, as will be understood from FIG. 3 also, the reverse-bias breakdown endurance Ersb remains substantially constant when the emitter width $L_E$ has a dimension of 70 to 100 microns or more.

It is to be understood that the present invention is applicable to P-N-P transistors as well as to N-P-N transistors described above in connection with the exemplary embodiment.

Figure 4:
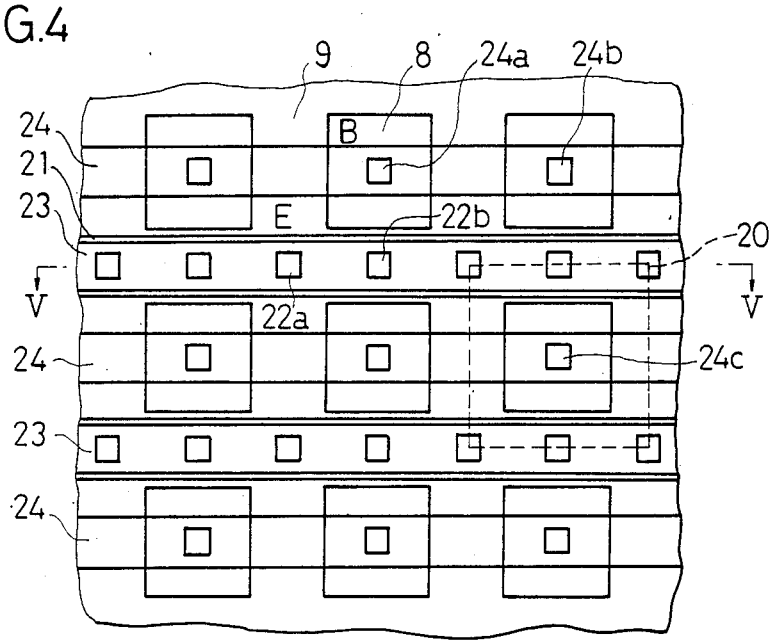
FIG. 4 is a plan view showing the structure of a second exemplary semiconductor device embodying the present invention.
Figure 5:
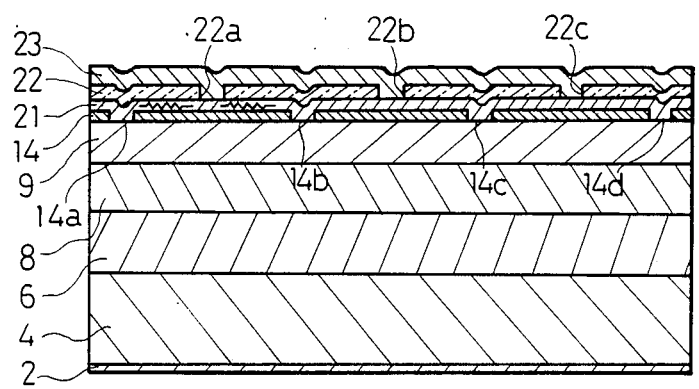
FIG. 5 is a sectional view along line V—V of FIG. 4.
Figure 6:
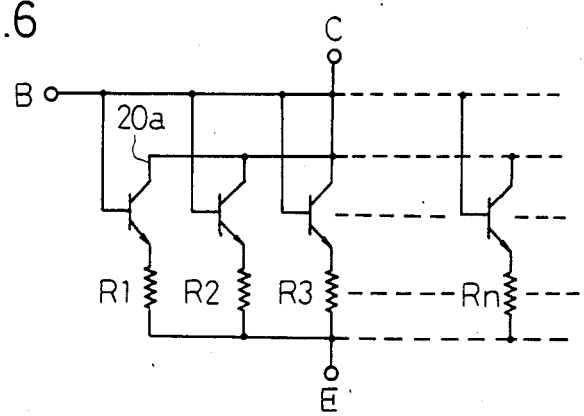
FIG. 6 is an equivalent circuit diagram of the second exemplary semiconductor device.

Referring now to FIGS. 4, 5 and 6, a second examplary semiconductor device will be described hereinafter.

In this example, as shown in FIG. 6, each transistor device 20a, constituting one unit cell 20 respectively, has emitter ballast resistance $R_1, R_2, \ldots, R_n$ of 5-30 ohm-cm to thereby increasingly uniform current density between unit cells.

As shown in FIGS. 4 and 5, on an insulator film 14 which is deposited on an emitter layer 9, three layers are formed in a fixed pattern: a thin film resistance layer 21 consisting of such a conductive thin film as polysilicon and electrically connected to the emitter layer 9 via windows 14a–14d which are locally formed in the insulator film 14; and intermediate insulator film 22 consisting of silicon oxide or silicon nitride; and an emitter electorde 23 consisting of such a metal film as aluminum and electrically connected to the thin film reistance layer 21 via windows 22a–22c which are locally formed in the intermediate insulator film.

One end of the thin film resistance layer 21 is in ohmic contact with the emitter layer 9 through the windows 14a–14d of the insulator film 14. The other end of the thin film resistance layer 21 is in ohmic contact with the emitter electrode 23 through the windows 22a–22c of the intermediate insulator film 22. And a base electrode 24, which is simultaneously formed with the emitter electrode 23, is directly in ohmic contact with a base layer 8 through the windows 24a–24c, etc. of the insulator film 14.

And respective output electrodes are formed by collecting each emitter electrode 23 and each base electrode 24 into specified portions of the semiconductor device.

What is claimed is:

1. A semiconductor device comprising:
   a substrate acting as a collector area with a first conduction type;
   a base area, having a second conduction type, reverse to said first conduction type of said substrate, said base area being formed on said substrate; and
   an emitter area having said first conduction type, and which is formed in said base area in a mesh-like pattern,
   wherein the width of said emitter area ranges from 50 to 10 microns.

2. A semiconductor device having a power amplifier pattern comprising:
   a plurality of parallel connected transistor unit cells comprising a collector layer;
   a base layer formed on said collector layer; and
   a plurality of emitters formed in said base layer and being arrayed in a mesh-like shape which forms a plurality of base regions with a quadrangle shape, wherein
   a width of each said emitter of each transistor unit cell is not in excess of 50 microns.

3. A semiconductor device according to claim 2, wherein said collector layer is a substrate having a first conduction type, and said base layer is a second conduction type, opposite to said first conduction type of said substrate.

4. A semiconductor device according to claim 2, which further comprises an insulator film having a plurality of contact holes formed on said emitters, a polysilicon resistance layer connected to said emitters through said contact holes and an emitter electrode connected to said polysilicon resistance layer.

* * * * *